United States Patent [19]
Havelka et al.

[11] 3,971,186
[45] July 27, 1976

[54] WEDGE LOCK UNIT

[75] Inventors: Steven E. Havelka, Playa del Rey; Paul L. Graham, Culver City; Carl L. Matschke, Canoga Park, all of Calif.

[73] Assignee: Electronic Memories and Magnetics Corporation, Los Angeles, Calif.

[22] Filed: Aug. 13, 1975

[21] Appl. No.: 604,344

[52] U.S. Cl.............................. 52/753 G; 403/374; 403/409; 83/452
[51] Int. Cl.² .......................................... F16B 5/06
[58] Field of Search ........... 403/374, 356, 358, 409; 52/758 R, 758 C, 758 D, 753 G; 29/1 A, 1 D; 24/263 R, 263 A, 263 B, 263 SW, 263 LS, 263 DB; 83/452; 248/316 E, 226 B; 269/234

[56] References Cited
UNITED STATES PATENTS

| | | | |
|---|---|---|---|
| 419,072 | 1/1890 | Richards | 269/234 X |
| 419,073 | 1/1890 | Richards | 269/234 X |
| 1,138,368 | 5/1915 | Feeley | 403/374 X |
| 1,333,471 | 3/1920 | Davis | 269/234 X |
| 3,048,109 | 8/1962 | Feemster | 52/758 C X |
| 3,199,619 | 8/1965 | Hathaway | 177/154 X |
| 3,404,907 | 10/1968 | Kane et al | 403/358 X |
| 3,489,447 | 1/1970 | Weyer | 52/758 R |
| 3,847,493 | 11/1974 | Peter | 403/374 X |

FOREIGN PATENTS OR APPLICATIONS

| | | | |
|---|---|---|---|
| 1,051,667 | 9/1953 | France | 24/263 SW |
| 1,192,885 | 5/1965 | Germany | 403/358 |

*Primary Examiner*—Wayne L. Shedd
*Attorney, Agent, or Firm*—Lindenberg, Freilich, Wasserman, Rosen & Fernandez

[57] ABSTRACT

A wedge lock unit is disclosed for clamping a subsystem chassis with two outwardly extending spaced apart flanges to a system main frame, from which a single flange or tab extends outwardly. The wedge lock unit includes a stationary member which is fixedly attached to one of the flanges of the subsystem chassis. The stationary member has two opposite wedged or sloping sides along which two movable wedging members with mating sloping sides rest. A drive mechanism, in the form of a rotatable screw, is used to apply a force, resulting in a clamping force, which urges the movable wedging members toward the tab of the main frame, which is inserted between the wedge lock unit and the other flange of the subsystem chassis, until the tab becomes clamped between the movable wedging members of the wedge lock unit and the other flange of the subsystem chassis. Spring means are provided which produce a reaction force on the movable wedging members. The reaction force direction is opposite the clamping force direction. When the clamping force is relieved, so as to unclamp the tab of the main frame, the reaction force urges the movable wedging members back to their unclamped position, thereby preventing the jamming of the movable wedging members against the unclamped tab of the system main frame.

12 Claims, 13 Drawing Figures

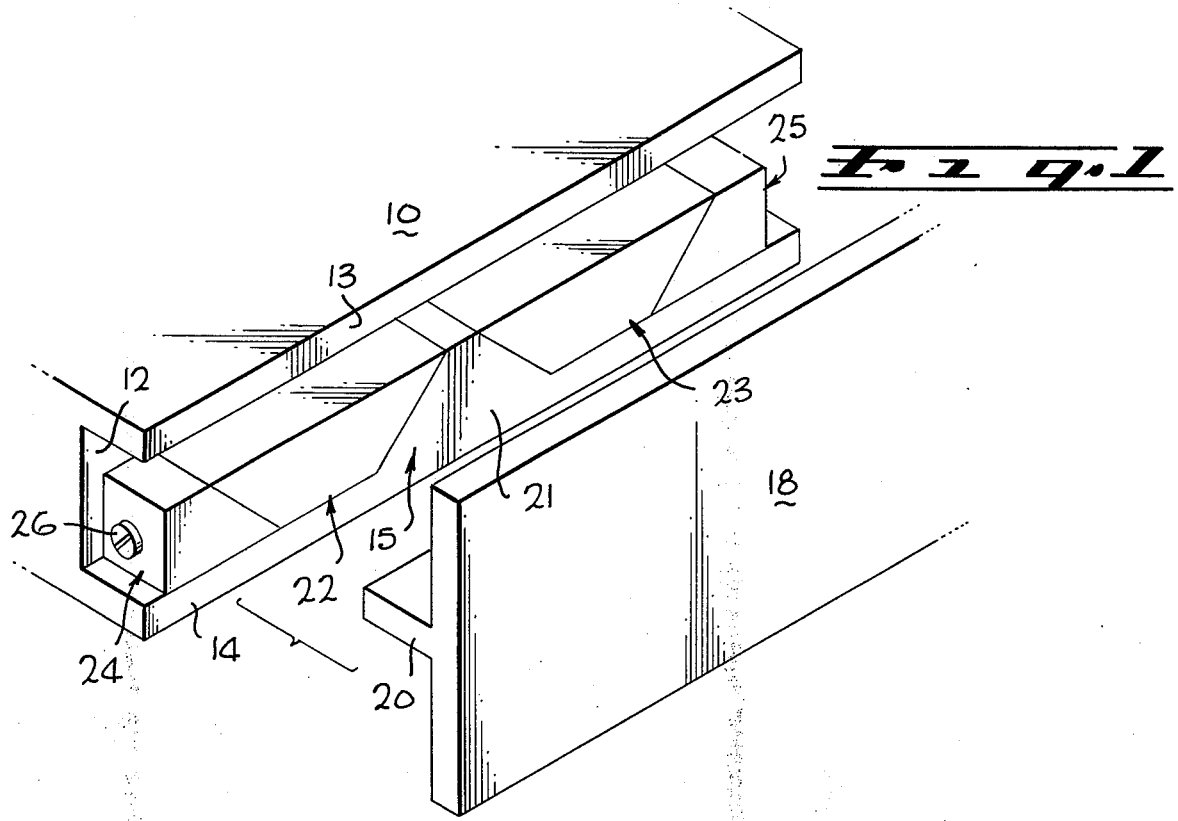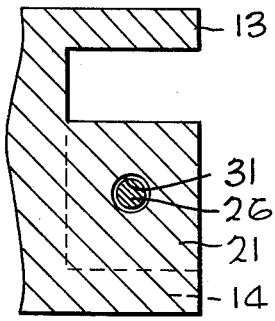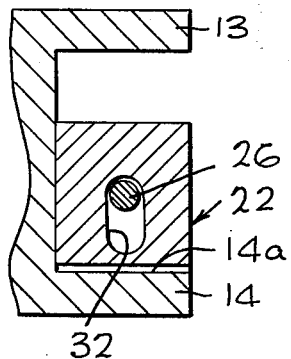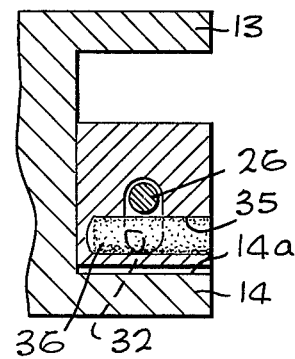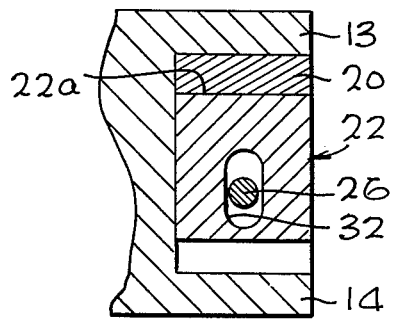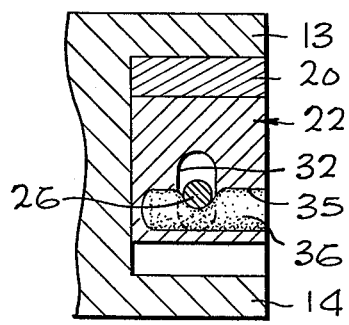

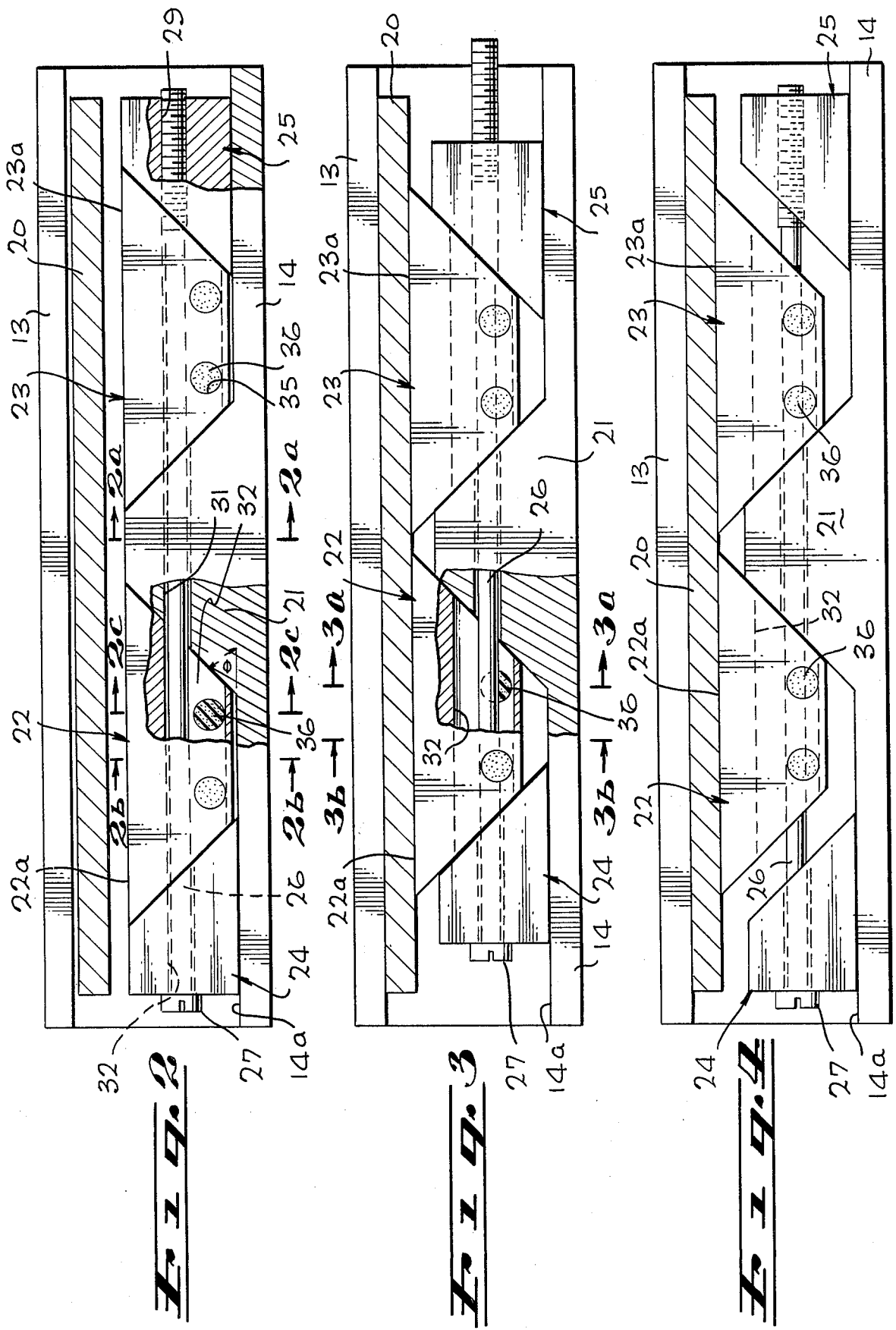

3,971,186

WEDGE LOCK UNIT

BACKGROUND OF THE INVENTION

1. Field of the Invention

The present invention generally relates to locking devices and, more particularly, to wedge type locking devices, finding particular application in clamping separate subsystems to a system chassis or frame.

2. Description of the Prior Art

In the electronic art, electronic systems often comprise separate subsystems, each of which is generally mounted on a separate structure or chassis. These are assembled into the system by separately clamping each subsystem chassis to the system frame. Such an arrangement facilitates the easy removal of any subsystem for maintenance or replacement without having to remove any of the other subsystems. Practically every modern computer includes a main frame to which separate electronic subsystems are clampable. One clamping device which has been used in the prior art is a wedge type locking device, hereinafter simply referred to as the wedge lock. Typically, it includes a stationary wedge-shaped member which is fixedly connected to a flange of the subsystem. It also includes a movable wedging member. To clamp the subsystem chassis to the main frame a screw or other device is used to urge the movable wedging member toward a flange of the main frame and thereby clamp the subsystem chassis thereto. Unclamping or unlocking is achieved by turning the screw so as to release the movable wedging member and move it away from the main frame flange.

It has been found that with known wedge locks, although subsystem clamping to the main frame is easily achievable, the known wedge locks do not perform satisfactorily when attempting to unclamp the subsystem chassis from the main frame. This is particularly due to the fact that the movable wedging member becomes jammed against the main frame flange, and in most instances it does not separate itself therefrom, thereby preventing the desired unclamping. Hereinbefore, with most known wedge locks some brute force or special tools have to be used to disengage the jammed movable wedging member from the main frame flange in order to unclamp the subsystem chassis therefrom.

The present invention is directed to an improved wedge lock in which jamming of the movable wedging member is eliminated, thereby facilitating the clamping and unclamping of the subsystem chassis from the main frame.

SUMMARY OF THE INVENTION

In several embodiments of the wedge lock of the present invention, means are provided to produce a small reaction force in a direction which is opposite the direction of the clamping force. Consequently, when the wedge lock is unclamped, thereby removing the clamping force, the reaction force acts on the movable wedging member, urging it to move in a direction away from the flange against which it was clamped. As a result, the movable wedging member is separated from the flange against which it was clamped, and jamming is eliminated. The novel wedge lock of the present invention is designed to provide clamping forces sufficient to provide mechanical rigidity between the clamped subsystem chassis and the main frame, as well as sufficient surface contact to enable heat to be conducted from the subsystem chassis to the main frame, which serves as a heat sink.

The novel features of the invention are set forth with particularity in the appended claims. The invention will best be understood from the following description when read in conjunction with the accompanying drawings.

BRIEF DESCRIPTION OF THE DRAWINGS

FIG. 1 is an isometric view of one embodiment of the invention;

FIG. 2 is a side view, partially broken away, of the wedge lock in the unclamped position;

FIGS. 2a, 2b and 2c are cross sectional views of parts of the wedge lock in the unclamped position;

FIG. 3 is a side view, partially broken away, of the wedge lock in the clamped position;

FIGS. 3a and 3b are cross sectional views of the parts of the wedge lock in the clamped position;

FIG. 4 is a side view of the wedge lock useful in explaining the advantages of the present invention;

DESCRIPTION OF THE PREFERRED EMBODIMENTS

Figure 5:
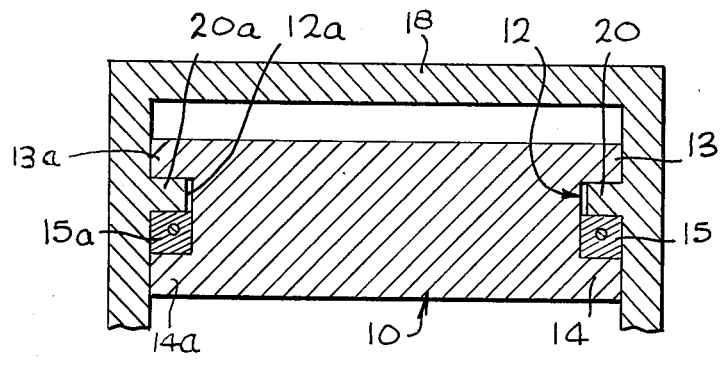
FIG. 5 is a view showing the use of the wedge lock in clamping a subsystem chassis to a system main frame.

Attention is directed to FIG. 1 in connection with which a specific embodiment of the wedge lock of the invention, which was actually reduced to practice, will be described. Therein, numeral 10 designates a subsystem chassis, terminating in a C-shaped end 12. It consists of two outwardly extending spaced apart flanges 13 and 14 with the novel wedge lock 15, shown supported on the bottom flange 14. The function of the C-shaped end 12 and the wedge lock 15 is to clamp the chassis 10 to a main frame 18 from which a flange or tab 20 extends. Clamping is achieved by first accommodating the tab 20 between flange 13 and the wedge lock 15, and thereafter clamp the tab 20 between flange 13 and the wedge lock 15.

The wedge lock 15 is shown including a central stationary wedge member 21 which is fixedly connected to or extends from bottom flange 14. The wedge lock includes two movable wedging members 22 and 23, a top end member 24 and a bottom end member 25. A shaft or screw 26 extends through all the members 21–25. As will be described hereinafter in detail, by turning the screw in one direction, hereinafter referred to as the clamping direction, end members 24 and 25 move toward one another, thereby causing the movable wedging members 22 and 23 to move upwardly toward flange 13. On the other hand, when the screw 26 is rotated in a second direction, referred to as the unclamping direction, the movable wedging members 22 and 23 move back toward the bottom flange 14.

The manner in which clamping and unclamping without jamming is achieved with the novel wedge lock of the present invention may best be explained in connection with FIGS. 2–4 which are essentially front views of the C-shaped end 12 and the wedge lock 15 with the tab 20 shown inserted therein. FIGS. 2 and 3 show the arrangement in the unclamped and clamped conditions respectively, with portions of the wedge lock partially broken away. FIG. 4 shows the arrangement in the unclamped condition but before the movable wedging member 22 and 23 are separated, so as to become unjammed from tab 20, due to the reaction force, provided in accordance with the teachings of the present invention.

As shown in FIG. 2 each of the wedge lock members 21-25 has an opening to accommodate the screw 26 therein. The screw is actually a circular shaft or rod, capped at its top end by a head 27 which abuts against top end member 24. The opposite end of screw 26 is threaded to engage threads 29 in the bottom end member 25. When the latter is fabricated of a relatively soft metal, such as aluminum, a threaded steel insert is inserted in member 25. The latter can be thought of as serving as a nut for screw 26.

As seen from FIG. 2a, which is a cross sectional view along lines 2a—2a of FIG. 2, the opening in the stationary wedge member 21 which is designated by numeral 31, is of a diameter only slightly greater than the diameter of screw 26, to provide clearance for the latter therethrough. Since member 21 is fixed to flange 14, when the screw 26 is inserted through member 21 it is axially aligned with flange 14 and is at a fixed distance therefrom. The opening 32 in member 24 is of the same diameter as that of opening 31. Also the threaded opening in member 25 is only sufficiently large to engage the threaded end of screw 26. Thus, members 24 and 25, when the screw 26 is inserted therein, cannot move away from flange 14 toward flange 13. However, they are free to slide on the top surface 14a of flange 14.

Unlike the openings in members 21, 24 and 25, the opening in each of movable wedging members 22 and 23 is considerably larger than opening 31, so as to enable each of these members to move upwardly, even when the screw 26 passes therethrough. Since members 22 and 23 are identical only member 22 will be described in detail. FIG. 2b is a cross sectional view along lines 2b—2b in FIG. 2. As seen, the opening 32 in movable wedging member 22 is oval shaped, so as to accommodate therein the screw 26 in the unclamped position as shown in FIG. 2b, as well as when the movable wedging member is moved upwardly to clamp tab 20.

As seen from FIG. 2 and from FIG. 2c, which is a cross sectional view of member 22 along lines 2c—2c in FIG. 2, member 22 includes a pair of spaced apart small holes 35 in a direction perpendicular to opening 32. A spring member, such as a small rubber rod 36 is inserted in hole 35, and by means of a bonding compound is retained therein. It is the function of rods 36, which act as springs, to provide the reaction force to the movable wedging member 22 in order to prevent it from jamming during unclamping.

In operation, clamping is achieved by rotating screw 26 in the clamping direction in which end members 24 and 25 move toward one another. Due to the sloping or wedged sides of the various members the screw tensile force in the axial direction is translated into an upward force, representing a clamping force, which causes the movable members 22 and 23 to slide upwardly on the wedged sides of members 21, 24 and 25. Since the screw 26 remains fixed in its axial direction, as the movable member 22 moves up the screw 26 comes in contact with the two spring rubber rods 36 and compresses the latter. Since the screw cannot move up the compressed rubber rods 36 apply a small reaction force to the member 22 in the downward direction. That is, the reaction force is in a direction opposite to the clamping force direction, which urges the member 22 to move up.

The reaction force, however, is much smaller than the clamping force. Consequently, when screw 26 is rotated in the clamping direction and members 24 and 25 move closer toward one another members 22 and 23 move up, even though the compression of the rubber rods 36 increases, thereby increasing the reaction force, applied to each of members 22 and 23. The screw is rotated in the clamping direction until the movable wedging members 22 and 23 move up sufficiently to clamp the tab 20 between the top flange 13 and the top surfaces 22a and 23a of the movable wedging members 22 and 23 respectively, with a sufficient clamping force, to insure mechanical rigidity between the subsystem chassis 10 and the main frame 18 from which tab 20 extends.

In electronic system assemblies the chassis 10 generally supports electronic circuits which generate heat. It is generally desirable to conduct the generated heat from the electronic circuits. The wedge lock 15 is designed so as to optimize the area of the top surfaces 22a and 23a of the movable wedging members 22 and 23, so that when they clamp the tab 20 of frame 18, heat is conducted from the flange 13 and the movable members 22 and 23 to tab 20 and therefrom to the frame 18, which acts as a heat sink. The chassis 10 as well as tab 20 and frame 18 and the wedge lock 15 are fabricated of materials which are good heat conductors.

FIG. 3 is a view of the wedge lock in the clamped position. FIG. 3a is a cross-sectional view of member 22, tab 20 and flange 13 along lines 3b—3b in FIG. 3, while FIG. 3b is a cross-sectional view of member 22, tab 20, and flange 13, along lines 3a—3a in FIG. 3. As seen from FIG. 3a when the movable member 22 is in the clamped position the screw 26 is accommodated in the lower portion of opening 32, and as seen from FIG. 3b in this position the screw 26 greatly compresses the spring rubber rods 36 which produce the reaction force.

Unclamping is achieved by rotating the screw 26 in the unclamping direction so as to move members 24 and 25 away from one another, as shown in FIG. 4, thereby reducing and finally eliminating the clamping force which forced the movable wedging members 22 and 23 upwardly. Once the clamping force is removed each movable wedging member 22 or 23 is free to become disengaged from tab 20. In the prior art the movable wedging member or members, though free to become disengaged from the previously clamped tab once the clamping force is removed, do not disengage themselves from the clamped member. Rather, quite often, they become jammed against it, thereby preventing free unclamping or unlocking from taking place.

The jamming is believed to occur due to the fact that even when the clamping force is removed the wedged sides of the movable members 22 and 23 and those of stationary member 21 remain jammed against one another, thereby preventing the movable members from becoming separated from the clamped tab 20. Such jamming is completely eliminated in the wedge lock of the present invention.

In the novel wedge lock 15 once the clamping force is removed, the only force present in each movable wedging member 22 or 23 is the reaction force, due to the compression of the rubber rods 36 by the screw 26 (see FIG. 3b). Since the distance of the screw 26 from flange 14 is fixed by the stationary member 21, the screw cannot move up by the force, applied thereto by the compressed rubber rods. Thus, the reaction force is relieved only by the rubber rods pushing down on the movable wedging member 22 in a direction away from the previously clamped tab 20.

The downwardly directed reaction force on the movable member 22 (or member 23) causes it to slide down along its wedged sides which are in contact with the wedged sides of the adjacent members, thereby completely disengaging it from the previously clamped tab 20. The reaction force is sufficient to cause the sliding motion of the movable members along their wedged sides with respect to the adjacent members. Thus, the jamming between the movable members and the adjacent members of the wedge lock as well as between the movable members and the previously clamped tab is completely eliminated.

FIG. 4 is an exaggerated view in which the end members 24 and 25 are spaced apart as in the unclamped position, while the movable members 22 and 23 are shown in the clamped position. In practice, as the screw 26 is turned in the unclamping direction, as soon as the clamping force decreases to below the reaction force the movable members 22 and 23 start their downward sliding motion and become disengaged from the tab 20. They move downwardly to fill the spaces between the stationary member 21 and the end sliding members 24 and 25, until the rods 36 are no longer compressed by screw 26 (see FIG. 2c), when the reaction force becomes zero.

From the foregoing it should thus be appreciated that in the novel wedge lock of the present invention, jamming, which characterizes practically all known prior art wedge lock devices, is eliminated, by providing means to produce a reaction force, in a direction opposite to the direction of the clamping force. Consequently, during unclamping, when the clamping force is reduced to below the reaction force, the latter urges the wedging member or members to become disengaged from the previously clamped tab or flange, and return to its position in the wedge lock as in the unclamped position.

It is appreciated by those familiar with the art that the smaller the wedge angle, designated by $\theta$ in FIG. 2, the larger is the clamping force for the same tensile force assuming the same frictional coefficient on the sloping or sliding sides of the wedging members. However, with larger clamping forces, larger reaction forces are desirable to eliminate the jamming effect. In the embodiment which was actually reduced to practice, $\theta$ was chosen to be on the order of 45°.

Although the invention has been described in connection with an arrangement in which the C-shaped end 12 and the tab 20 are in a horizontal plane (see FIG. 1) in practice, the clamping is generally performed with both units being in a vertical plane, as shown in FIG. 5. Also, in practice, the subsystem chassis 10 is clamped at both ends. In FIG. 5 a C-shaped end, opposite end 12, is designated by 12a, and the tab from the frame 18 to which it is clamped is designated by 20a, while the wedge lock associated with end 12a is designated by 15a. The two flanges of end 12a are designated as 13a and 14a. It should be appreciated that in a practical system many pairs of opposite tabs extend outwardly from the main frame 18, to which different subsystem chassis are clamped.

Hereinbefore it was assumed that the subsystem chassis 10 includes two spaced apart flanges such as flanges 13 and 14 which form the C-shaped end 12 and that the wedge lock 15 is associated with one of these flanges, to clamp a single tab 20 extending from the main frame 18. It should be stressed that the frame 18 may include two spaced apart tabs and the chassis 10 may include a single flange with the wedge lock 15, so as to clamp the chassis 10 to the frame 18. Also, the wedge lock may be coupled to the tab 20 extending from the main frame 18, rather than be part of the subsystem chassis 10. It is believed however, that in most practical applications it is preferable to couple the wedge lock 15 to the subsystem chassis 10.

Figure 6:
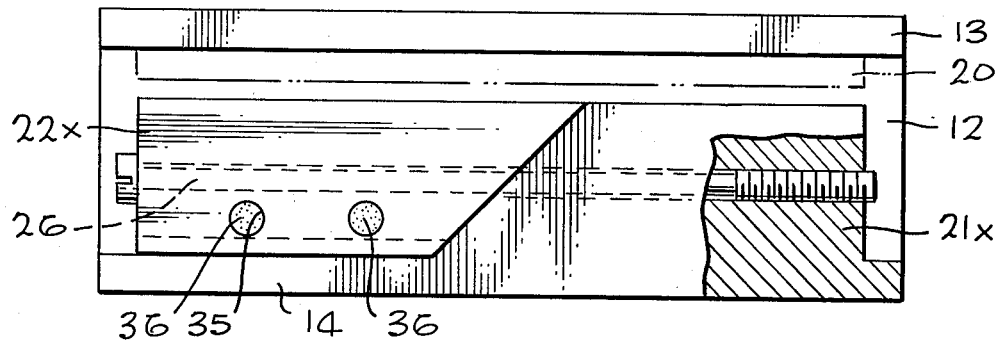
FIG. 6 is a side view of another embodiment of the invention.

It should be appreciated that the invention is not intended to be limited to the embodiment hereinbefore described, with two movable wedging members 22 and 23. The novel wedge lock may consist of a single movable wedging member and if desired may also exclude the end members 24 and 25. Such an embodiment is shown in FIG. 6. In this embodiment, shown in the unclamped position, the stationary member 21X which is attached to flange 14 performs the functions of both members 21 and 25 of the prior described embodiment, while the movable wedging member 22X performs the function of members 22 and top member 24. It should be pointed out however, that in the embodiment of FIG. 6 the movable wedging member 22X moves upwardly as well as sidewise, while in the previously described embodiment each of the movable wedging members 22 and 23 moves only upwardly, namely only in the direction of the clamping force.

Hereinbefore, it was assumed that the wedge lock 15 includes a stationary member such as member 21 in FIGS. 2–4, or member 21X in FIG. 6, which is fixedly attached to one of the flanges, such as flange 14. Although such embodiments are believed to be preferred ones, these members need not be fixedly attached to one of the flanges to attain the unjamming advantages, realized with the wedge lock of the present invention. As long as means are provided to produce a reaction force during clamping, which is in a direction opposite to the clamping force direction, jamming during unclamping is practically eliminated. This is so since during unclamping, once the clamping force is reduced to below the reaction force, the latter urges its wedging member away from the tab or flange against which it was previously pressed, to provide clamping.

Figure 7:
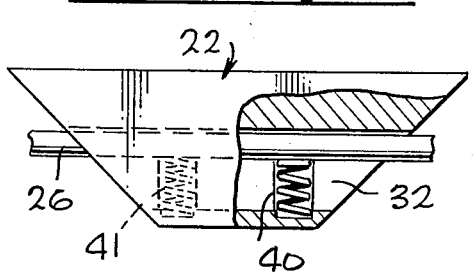
FIG. 7 is a side view of another embodiment of a movable wedging member of the wedge lock of the present invention.

Hereinbefore, rubber rods 36 have been described to provide the reaction force when the rods are compressed by screw 26 during clamping. Clearly, any other spring means which are compressible can be employed instead of the rubber rods. For example, leaf springs may be inserted in holes 35, which will be compressed by the screw 26 as each movable wedging member moves toward the tab to be clamped. If space limitations are not present one or more coil springs may be inserted into each movable member as shown in FIG. 7. Therein, the holes 35, previously described in connection with FIGS. 2 and 2c, are replaced by holes 40, through which coil springs 41 are inserted. As the member 22 moves toward the tab 20 during clamping the screw 26 compresses the springs 41, which provide the reaction force to move the member away from the tab 20, once the clamping force is reduced to zero during unclamping.

Summarizing the foregoing description the present invention comprises a wedge lock for releasably mechanically clamping two structures, defined as the first and second structures to one another. The first structure (e.g., chassis 10) includes two, first and second, spaced apart flanges (13 and 14), while the second structure 18 includes a single flange 20, which is insertable between the two flanges of the first structure. The wedge lock 15 includes at least two wedge shaped members with mating wedged or sloping sides. The wedge lock which is inserted between the first flange 14 of the first structure 10 and the single tab 20 of the second structure 18, includes means (screw 26) for producing a clamping force which causes the two members of the wedge lock to move relative to one another along their wedged sides, thereby urging one of the members toward the first flange 14 while the other member moves toward the single flange 20 of the second structure 18, until the single flange 20 is clamped between the moving member of the wedge lock and the second flange 13 of the first structure 10, and the other member of the wedge lock is pressed against the first flange 14 of the first structure 10. The wedge lock includes means (rods 36 or springs 41) which provide a reaction force when said clamping force is produced, in a direction opposite to the clamping force direction. Consequently, when the two structures are to be unclamped and the clamping force is removed, the reaction force forces the members of the wedge lock toward one another thereby separating the wedge lock members from the flanges against which they were clamped, without jamming.

Figure 8:
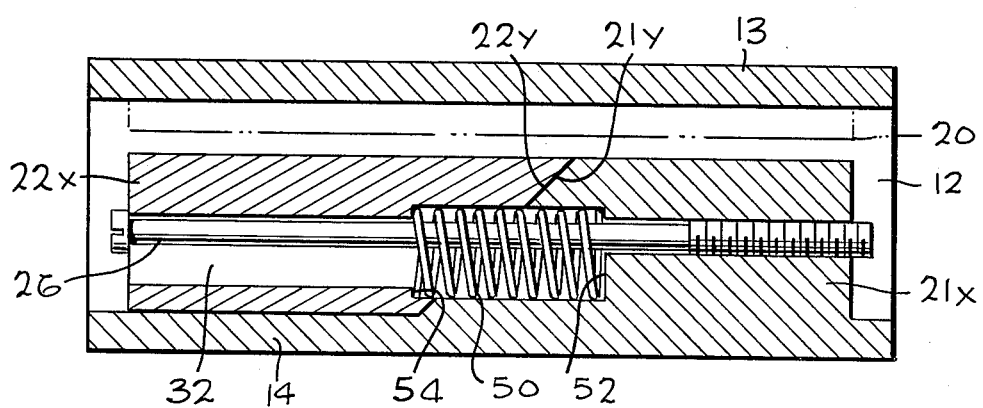
FIG. 8 is a cross sectional view of another embodiment of the invention.

In all of the above-described embodiments the reaction force, whether produced by the compressed rubber rods 36 (see FIG. 2c) or the springs 41 (see FIG. 7) is in a direction which is opposite to the clamping force direction. The invention however, is not intended to be limited thereto. As will become apparent from the description of FIG. 8 the reaction force may be in a direction other than opposite to the clamping force. FIG. 8 is a cross-sectional view of another embodiment of the wedge lock, which is similar to that shown in FIG. 6. However, whereas in the embodiment of FIG. 6 the reaction force is provided by the compressed rods 36 in holes 35, in the embodiment shown in FIG. 8, the reaction force is provided by a compressible coil spring 50.

The spring 50 is shown surrounding the screw 26. The stationary wedging member 21X defines a recess 52 in which one end of the spring is accommodated, while its other end is accommodated in a recess 54 in the movable wedging member 22X, which extends from the hole 32. In operation, as the screw is tightened and member 22X is urged toward member 21X the spring 50 is compressed. It is the spring compression which produces the reaction force. When the two members 21X and 22X come in contact along their sloping or wedged sides respectively, designated by 21Y and 22Y, and the turning of the screw 26 in the clamping direction continues the member 22X slides on member 21X and moves further to the right (in FIG. 8) as well as upwardly toward tab 20 which is to be clamped. Thus, the spring compression increases. Also, the spring is subjected to a small lateral motion as the member 22X moves up toward tab 20.

During unclamping, as the screw 26 is rotated in the unclamping direction, when the clamping force is less than the reaction force the compressed spring 50 pushes member 22X away from the stationary member 21X thereby separating the sloping sides 21Y and 22Y from one another. As is appreciated by those familiar with the art and as previously pointed out, the primary cause for jamming in a wedge lock is due to the fact that during unclamping the sloping sides of the stationary and movable members do not separate themselves from one another. However, in accordance with the present invention, the spring 50 separates these sides from one another and therefore jamming is eliminated.

It should be pointed out that in the embodiment of FIG. 8 the reaction force provided by the spring 50 is not in a direction opposite to the clamping force. Rather, it is essentially in a direction which is 90° with respect to the clamping force direction. In FIG. 8, only one spring 50 is shown, since in this figure the wedge lock is assumed to include a single movable member. For the embodiment previously described in connection with FIGS. 2–4 two such springs may be employed. Each spring would have one end accommodated in a recess in the stationary member 21, and an opposite end in one of the movable members 22 and 23.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. In a wedge lock of the type including at least first and second separate members with mating wedged sides and operable means for selectively applying a clamping force to said members to cause relative motion between said members, with said first member being in contact with a first flange of a first structure and said second member comes in contact and clamps a flange of a second structure against a second flange of said first structure, the improvement comprising:

means for producing a reaction force when said clamping force is applied to said members of said wedge lock, the direction of said reaction force being opposite to the clamping force direction, whereby when said clamping force is removed, said reaction force urges said second member to become separated from the flange of said second structure and moves toward the first member of said wedge lock.

2. The improvement as described in claim 1 wherein said operable means comprises a screw extending through said first and second members of said wedge lock, said screw being rotatable in a clamping direction to urge the members toward one another causing said members to move with respect to one another along their mating wedge sides, and said means for producing said reaction force comprise compressible spring means, compressed by said screw as said screw is rotatable in said clamping direction, to produce said reaction force in a direction opposite said clamping force direction.

3. The improvement as described in claim 2 wherein said first member of said wedge lock is fixedly attached to the first flange of said first structure and defining an opening through which said screw extends so as to maintain the screw axially parallel to said first flange at a substantially fixed distance therefrom, with said second member being movable away from said first flange when said clamping force is applied by said screw, and being urged back toward said first flange by said reaction force when said clamping force is removed.

4. The improvement as described in claim 3 wherein said wedge lock includes a third member with a wedged side, said first member having two opposite wedged sides with said second and third members being on opposite sides of said first member with their wedged sides mating the opposite wedged sides of said first member, with said screw extending through said third member, each of said second and third members being movable away from said first flange when said clamping force is applied by said screw, and being urged back toward said first flange by said reaction force when said clamping force is removed.

5. An arrangement comprising:
a structural unit having a straight side extending in a selected direction; and
wedge lock means including at least first and second members with mating wedged surfaces, said first member being fixedly connected to said straight sides of said structural unit with the wedged surface of said first member extending at an angle $\theta$ with respect to said straight side, operable means for applying a force to urge said second member toward said first member whereby said second member slides along its wedged surface which mates the wedged surface of said first member and moves away from said straight side in response to a force component of the force applied by said operable means, the force component being definable as a clamping force and being in a direction away from said straight side, said wedge means further including force producing means for producing a reaction force when said second member moves away from said straight side, the reaction force direction being opposite to the clamping force direction whereby when said clamping force is removed, said reaction force urges said second member back toward said straight side.

6. The arrangement as described in claim 5 wherein said operable means includes a screw rotatable in a first direction definable as a clamping direction to provide said clamping force, said screw being axially aligned parallel to said straight side, with said force producing means comprising spring means which is compressible by said screw as said second member moves in a direction away from said straight side, said spring means providing said reaction force to urge said second member toward said straight side when said clamping force is removed, by rotating said screw in a second direction opposite said first direction.

7. The arrangement as described in claim 6 wherein said spring means are included in said second member of said wedge lock.

8. The arrangement as described in claim 6 wherein said first member further defines first and second opposite wedged surfaces and said wedge lock includes a third member with a wedged surface, with the first and second wedged surfaces of said first member mating the wedged surfaces of said second and third members located on opposite sides of said first member with both said second and third members moving away from said straight side when said clamping force is applied, and are urged back toward said straight side by said reaction force when said clamping force is removed.

9. The arrangement as described in claim 8 wherein each of said second and third members include said spring means for providing the reaction forces to each of said second and third members.

10. The arrangement as described in claim 9 wherein said straight side defines a first flange extending from said structural unit, the latter further including a second flange spaced apart from said parallel to said first flange, with said wedge lock being between said flanges, the space between said second flange and said wedge lock being large enough to accommodate therein a flange of a second structural unit, the flange of the latter unit being clampable between said second flange and the top surfaces of said second and third members when the latter are moved away from said first flange by said clamping force and come in contact with the flange of said second structural unit.

11. An arrangement comprising:
a structural unit having a straight side extending in a selected direction; and
wedge lock means including at least first and second members with mating wedged surfaces, said first member being fixedly connected to said straight side of said structural unit with the wedged surface of said first member extending at an angle $\theta$ with respect to said straight side, operable means for applying a force to urge said second member toward said first member whereby said second member slides along its wedged surface which mates the wedged surface of said first member and moves away from said straight side in response to a force component of the force applied by said operable means, the force component being definable as a clamping force and being in a direction away from said straight side, said wedge means further including force producing means for producing a reaction force when said second member is urged toward said first member, with the wedged surfaces mating one another, the reaction force being in a direction whereby when said clamping force is removed, said reaction force urges said second member away from said first member.

12. The arrangement as described in claim 11 wherein said force producing means comprises a compressible spring, which is compressed when the wedged surfaces of said first and second members mate one another, whereby when said clamping force is removed said compressed spring urges said second member away from said first member.

* * * * *